United States Patent
Yen et al.

(10) Patent No.: US 11,004,840 B2
(45) Date of Patent: May 11, 2021

(54) ELECTROSTATIC DISCHARGE PROTECTION STRUCTURE

(71) Applicant: UNITED MICROELECTRONICS CORP., Hsin-Chu (TW)

(72) Inventors: Shih-Che Yen, Taoyuan (TW); Tien-Hao Tang, Hsinchu (TW); Chun Chiang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 220 days.

(21) Appl. No.: 16/200,662

(22) Filed: Nov. 27, 2018

(65) Prior Publication Data

US 2020/0144814 A1 May 7, 2020

(30) Foreign Application Priority Data

Nov. 6, 2018 (TW) ................................. 107139297

(51) Int. Cl.
*H01L 27/02* (2006.01)
*H02H 9/04* (2006.01)

(52) U.S. Cl.
CPC ...... *H01L 27/0266* (2013.01); *H01L 27/0255* (2013.01); *H02H 9/046* (2013.01)

(58) Field of Classification Search
CPC .. H01L 27/0266; H01L 27/0255; H02H 9/046
See application file for complete search history.

(56) References Cited

U.S. PATENT DOCUMENTS

| | | | |
|---|---|---|---|
| 5,465,189 A * | 11/1995 | Polgreen ............. | H01L 27/0259 257/357 |
| 7,518,845 B2 | 4/2009 | Gauthier, Jr. | |
| 2003/0197242 A1* | 10/2003 | Chen ............... | H01L 21/823878 257/509 |
| 2006/0268473 A1* | 11/2006 | Kemper .............. | H01L 27/0285 361/56 |
| 2013/0286520 A1* | 10/2013 | Shan ....................... | H01L 23/60 361/57 |

(Continued)

OTHER PUBLICATIONS

Ming-Dou Ker, A gate-coupled PTLSCR/NTLSCR ESD protection circuit for deep-submicron low-voltage CMOS IC's, IEEE journal of solid-state circuits, vol. 32, No. 1, Jan. 1997.

(Continued)

*Primary Examiner* — Rafael O De Leon Domenech
(74) *Attorney, Agent, or Firm* — Winston Hsu (57) ABSTRACT

A silicon controlled rectifier includes a substrate, an N-type well, a P-type well, a gate structure, a first N-type doped region, a second N-type doped region, a first P-type doped region, a second P-type doped region, a first STI, and a second STI. The N-type well and the P-type well are disposed in the substrate. The gate structure is disposed on the P-type well. The first N-type doped region is disposed in the N-type well at one side of the gate structure. The second N-type doped region is disposed in the P-type well at another side of the gate structure. The first P-type doped region is disposed in the N-type well. The second P-type doped region is disposed in the P-type well. The first STI is between the first N-type and first P-type doped regions. The second STI is between the second N-type and second P-type doped regions.

21 Claims, 5 Drawing Sheets

(56) References Cited

U.S. PATENT DOCUMENTS

2015/0236010 A1* 8/2015 Chen .................. H01L 27/0262
257/133

OTHER PUBLICATIONS

Ming-Dou Ker, Lateral SCR devices with low-voltage high-current triggering characteristics for output ESD protection in submicron CMOS technology, IEEE Transactions on Electron devices, vol. 45, No. 4, Apr. 1998.

* cited by examiner

FIG. 10

ELECTROSTATIC DISCHARGE PROTECTION STRUCTURE

BACKGROUND OF THE INVENTION

1. Field of the Invention

The present invention relates to an electrostatic discharge (ESD) protection structure, and more particularly to an ESD protection structure using a silicon controlled rectifier (SCR).

2. Description of the Prior Art

An ESD event refers to the phenomenon of electrical discharge of current for a short duration during which a large amount of current is provided to an integrated circuit (IC). The large current may be built-up from a variety of sources, such as the human body. An ESD event commonly results from the discharge of a high voltage potential and leads to pulses of high current over a short duration.

An ESD event is generated within an IC, illustratively, by human contact with the leads of the IC or by electrically charged machinery being discharged in other leads of an IC. When integrated circuits are installed into electrical products, these electrostatic discharges may destroy the IC, thus requiring expensive repairs.

Small electronic devices such as ICs are prone to damage and failure due to ESD. Therefore, various ESD protection structures are placed near the input, output, or bi-directional I/O pins of ICs to protect the ICs. One problem with the conventional ESD protection structure is that the turn-on time may be too slow for fast ESD events.

SUMMARY OF THE INVENTION

Accordingly, there exists a need in the art for an ESD protection structure with a short turn-on time.

According to a preferred embodiment of the present invention, an ESD protection structure includes an SCR. The SCR consists of a substrate, an N-type well disposed in the substrate, a P-type well disposed in the substrate, a gate structure disposed on the substrate and on the P-type well, a first N-type doped region disposed in the N-type well and at one side of the gate structure, a second N-type doped region disposed in the P-type well and at another side of the gate structure, a first P-type doped region disposed in the N-type well, a second P-type doped region disposed in the P-type well, a first STI embedded in the N-type well and disposed between the first N-type doped region and the first P-type doped region, and a second STI embedded in the P-type well and disposed between the second N-type doped region and the second P-type doped region.

According to another preferred embodiment of the present invention, an ESD protection structure includes an SCR. The SCR consists of a substrate, an N-type well disposed in the substrate, a P-type well disposed in the substrate, a gate structure disposed on the substrate and on the N-type well, a first P-type doped region disposed in the N-type well and at one side of the gate structure, a second P-type doped region disposed in the P-type well and at another side of the gate structure, a first N-type doped region disposed in the N-type well, a second N-type doped region disposed in the P-type well, a first STI embedded in the N-type well and disposed between the first P-type doped region and the first N-type doped region, and a second STI embedded in the P-type well and disposed between the second P-type doped region and the second N-type doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
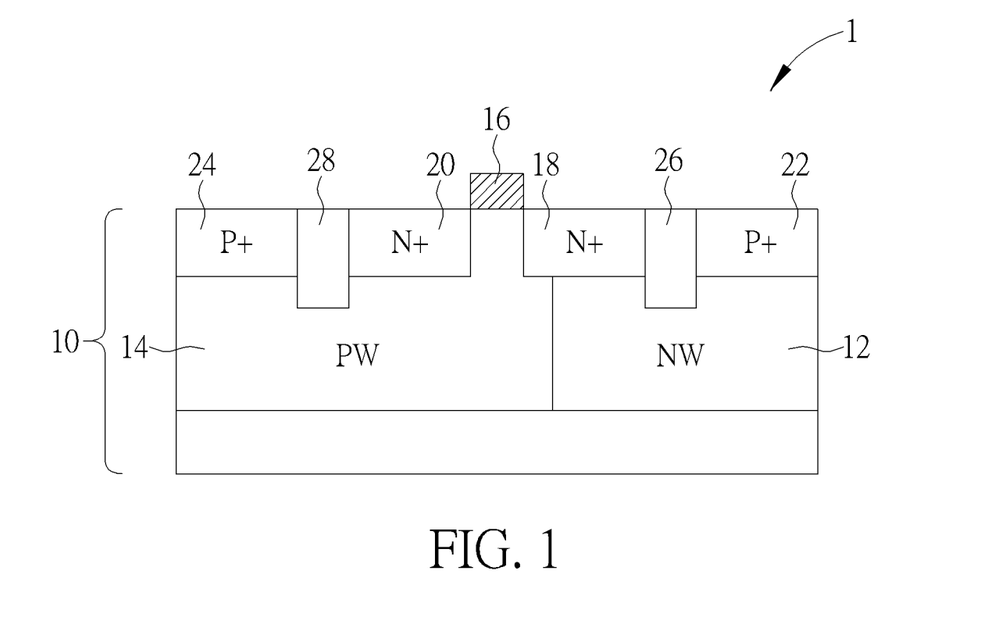
FIG. 1 depicts a sectional view of an SCR according to a first preferred embodiment of the present invention.

FIG. 1 depicts a sectional view of a silicon controlled rectifier according to a first preferred embodiment of the present invention. As shown in FIG. 1, a silicon controlled rectifier (SCR) 1 consists of/only includes a substrate 10, an N-type well 12, a P-type well 14, a gate structure 16, a first N-type doped region 18, a second N-type doped region 20, a first P-type doped region 22, a second P-type doped region 24, a first shallow trench isolation (STI) 26, and a second STI 28. The substrate 10 may be a silicon substrate, a germanium substrate, a gallium arsenide substrate, a silicon germanium substrate, an indium phosphide substrate, a gallium nitride substrate, a silicon carbide or a silicon on insulator substrate.

The N-type well 12 and the P-type well 14 are disposed in the substrate 10. The gate structure 16 is disposed on the substrate 10 and on the P-type well 14. The first N-type doped region 18 is disposed in the N-type well 12 and extends into the P-type well 14. The first N-type doped region 18 is disposed at one side of the gate structure 16. The second N-type doped region 20 is disposed in the P-type well 14 and at another side of the gate structure 16. In other words, the first N-type doped region 18 and the second N-type doped region 20 are respectively disposed at two opposite sides of the gate structure 16. The first P-type doped region 22 is disposed in the N-type well 12. The second P-type doped region 24 is disposed in the P-type well 14.

The first STI 26 is embedded in the N-type well 12 and between the first N-type doped region 18 and the first P-type doped region 22. The second STI 28 is embedded in the P-type well 14 and between the second N-type doped region 20 and the second P-type doped region 24. The first N-type doped region 18 is disposed closer to the P-type well 14 than the first P-type doped region 22 along a horizontal direction. The second N-type doped region 20 is disposed closer to the N-type well 12 than the second P-type doped region 24 along the horizontal direction. The horizontal direction is parallel to the top surface of the substrate 10.

Figure 2:
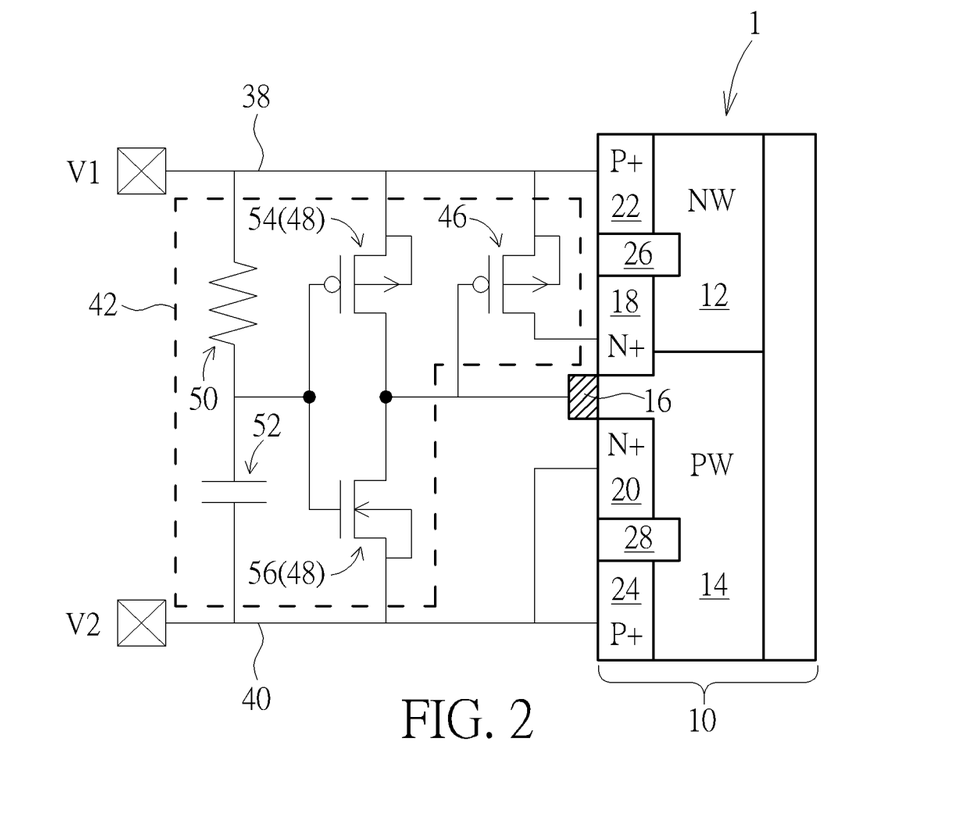
FIG. 2 depicts schematically an SCR electrically connected to an ESD protection circuit according to a first preferred embodiment of the present invention.
Figure 3:
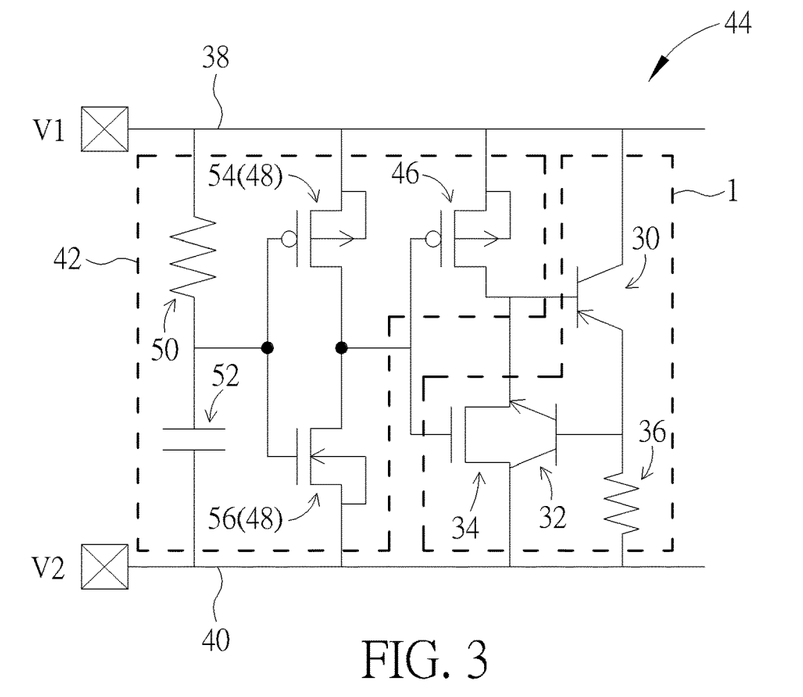
FIG. 3 depicts an equivalent circuit of an ESD protection structure according to a first preferred embodiment of the present invention.

FIG. 2 depicts schematically an SCR electrically connected to an ESD protection circuit according to a first preferred embodiment of the present invention. FIG. 3 depicts an equivalent circuit of an ESD protection structure according to a first preferred embodiment of the present invention. As shown in FIG. 2 and FIG. 3, the first P-type doped region 22, the N-type well 12 and the P-type well 14 together form a PNP transistor 30. The N-type well 12, the P-type well 14 and the second N-type doped region 20 together form an NPN transistor 32. The gate structure 16, the first N-type doped region 18 and the second N-type doped region 20 form a first N-type transistor 34. The PNP transistor 30 electrically connects to the NPN transistor 32 in series. The resistance of the substrate 10 is represented by a resistor 36. The resistor 36 electrically connects to the PNP transistor 30 and the NPN transistor 32 in series. In detail, the first P-type doped region 22 electrically connects to a first conductive line 38. The second N-type doped region 20 and the second P-type doped region 24 both electrically connect to a second conductive line 40. A first voltage V1 is applied to the first conductive line 38 and a second voltage V2 is applied to the second conductive line 40, where the first voltage V1 is greater than the second voltage V2. For example, the first voltage V1 can be a power supply, and the second voltage V2 can be ground. In another example, the first voltage V1 can be an I/O voltage, and the second voltage V2 can be ground. The first voltage V1 and the second voltage V2 are not limited to those mentioned above, however. Other types of voltage terminals can serve as the first voltage V1 and the second voltage V2 as long as the first voltage V1 is greater than the second voltage V2. Continue to refer to FIG. 2 and FIG. 3. The SCR 1 electrically connects to an ESD protection circuit 42. The SCR 1 and the ESD protection circuit 42 form an ESD protection structure 44. The ESD protection circuit 42 consists of/only includes a first P-type transistor 46, an inverter 48, a resistor 50 and a capacitor 52. A drain of the first P-type transistor 46 electrically connects to the N-type well 12 through the first N-type doped region 18. A source of the first P-type transistor 46 electrically connects to the first conductive line 38. The inverter 48 includes a second P-type transistor 54 and a second N-type transistor 56. The second P-type transistor 54 electrically connects to the second N-type transistor 56 in series. A source of the second P-type transistor 54 electrically connects to the first conductive line 38. A source of the second N-type transistor 56 electrically connects to the second conductive line 40. A gate of the first P-type transistor 46, the gate structure 16, a drain of the second P-type transistor 54 and a drain of the second N-type transistor 56 are electrically connected. The resistor 50 electrically connects to the first conductive line 38. The capacitor 52 couples to the resistor 50 in series. The capacitor 52 electrically connects to the second conductive line 40. The capacitor 52, the resistor 50, the gate of the second P-type transistor 54 and the gate of the second N-type transistor 56 are electrically connected.

Figure 4:
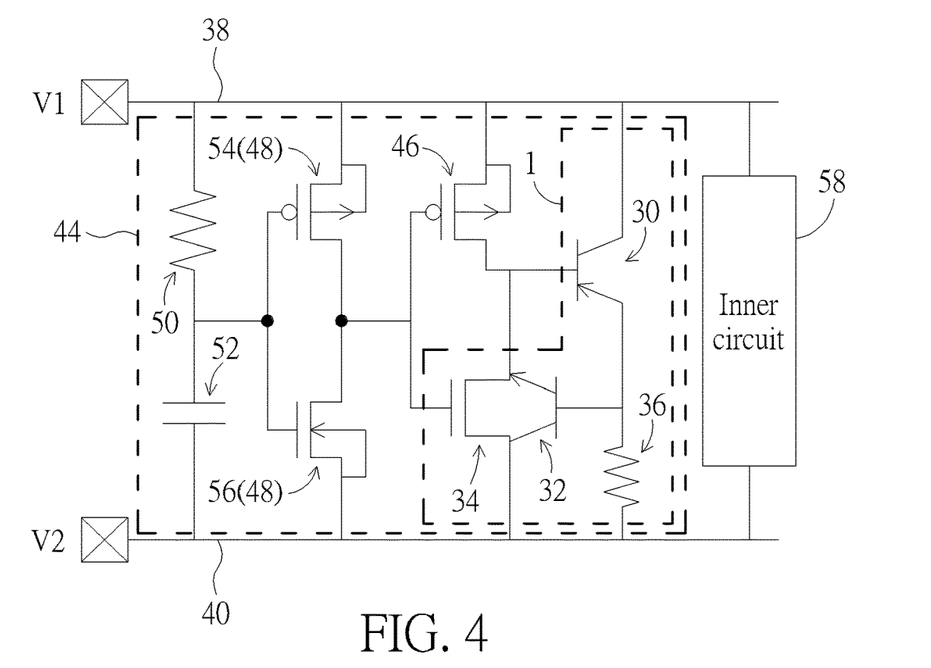
FIG. 4 depicts an ESD protection structure coupled to an inner circuit according to a first preferred embodiment of the present invention.

As shown in FIG. 4, an inner circuit 58 electrically connects to the first conductive line 38 and the second conductive line 40 and electrically connects to the ESD protection structure 44 in parallel. When the electrostatic pulse enters the first conductive line 38, a trigger voltage is generated between the resistor 50 and the capacitor 52 to turn on the inverter 48, thereby switching on the first N-type transistor 34 to activate the SCR 1. After activating the SCR 1, the electrostatic pulse in the first conductive line 38 goes through the SCR 1 into the second conductive line 40. Therefore, the electrostatic pulse will not damage the inner circuit 58.

Figure 5:
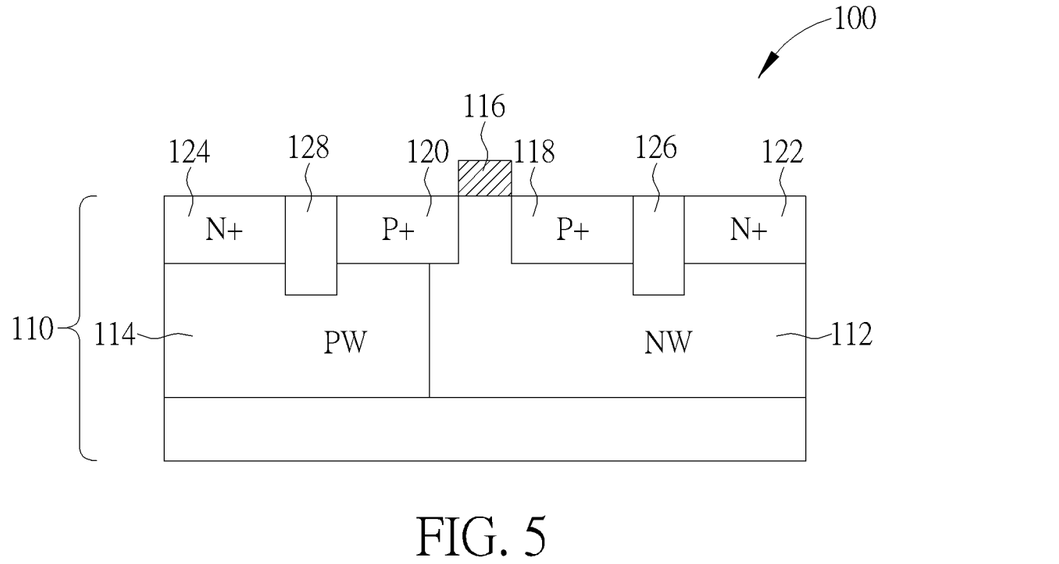
FIG. 5 depicts a sectional view of an SCR according to a second preferred embodiment of the present invention.

FIG. 5 depicts a sectional view of an SCR according to a second preferred embodiment of the present invention. As shown in FIG. 5, an SCR 100 consists of/only includes a substrate 110, an N-type well 112, a P-type well 114, a gate structure 116, a first P-type doped region 118, a second P-type doped region 120, a first N-type doped region 122, a second N-type doped region 124, a first STI 126, and a second STI 128. The substrate 110 may be a silicon substrate, a germanium substrate, a gallium arsenide substrate, a silicon germanium substrate, an indium phosphide substrate, a gallium nitride substrate, a silicon carbide or a silicon on insulator substrate.

The N-type well 112 and the P-type well 114 are disposed in the substrate 110. The gate structure 116 is disposed on the substrate 110 and on the N-type well 112. The first P-type doped region 118 is disposed in the N-type well 112 and at one side of the gate structure 116.

The second P-type doped region 120 is disposed in the P-type well 114 and at another side of the gate structure 116. Part of the second P-type doped region 120 extends into the N-type well 112. The first P-type doped region 118 and the second P-type doped region 120 are respectively disposed at two opposite sides of the gate structure 116. The first N-type doped region 122 is disposed in the N-type well 112. The second N-type doped region 124 is disposed in the P-type well 114. The first STI 126 is embedded in the N-type well 112 and between the first P-type doped region 118 and the first N-type doped region 122.

The second STI 128 is embedded in the P-type well 114 and between the second P-type doped region 120 and the second N-type doped region 124. The first P-type doped region 118 is disposed closer to the P-type well 114 than the first N-type doped region 122 along a horizontal direction. The second P-type doped region 120 is disposed closer to the N-type well 112 than the second N-type doped region 124 along the horizontal direction. The horizontal direction is parallel to the top surface of the substrate 110.

Figure 6:
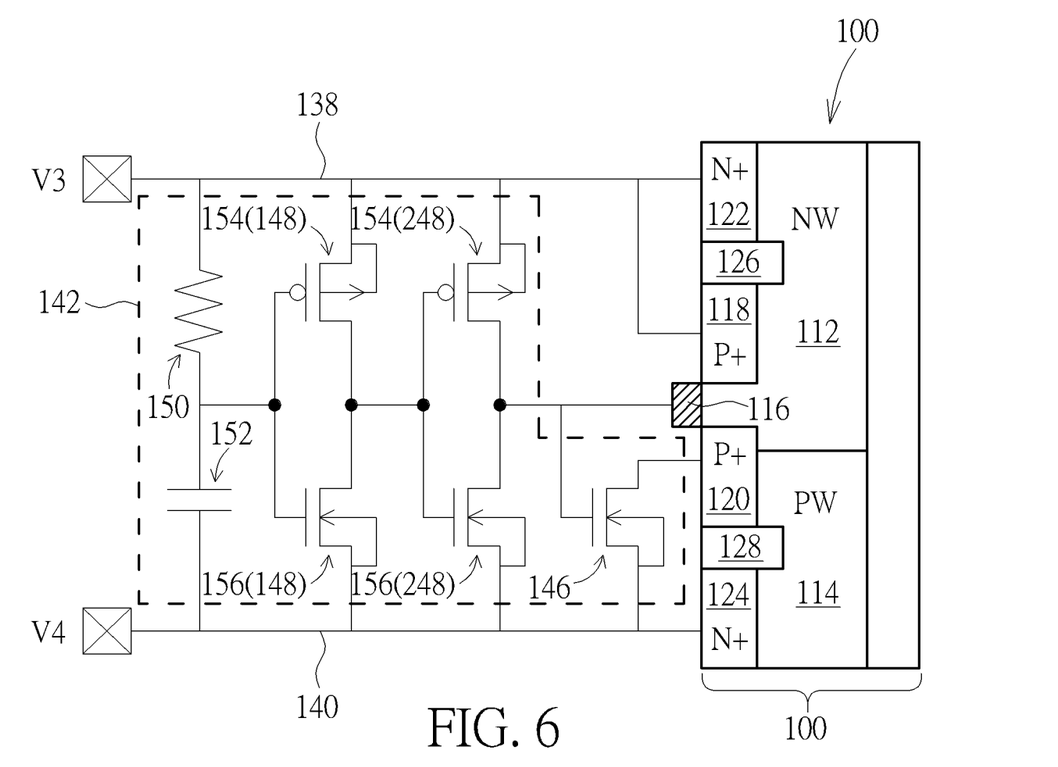
FIG. 6 depicts schematically an SCR electrically connected to an ESD protection circuit according to a second preferred embodiment of the present invention.
Figure 7:
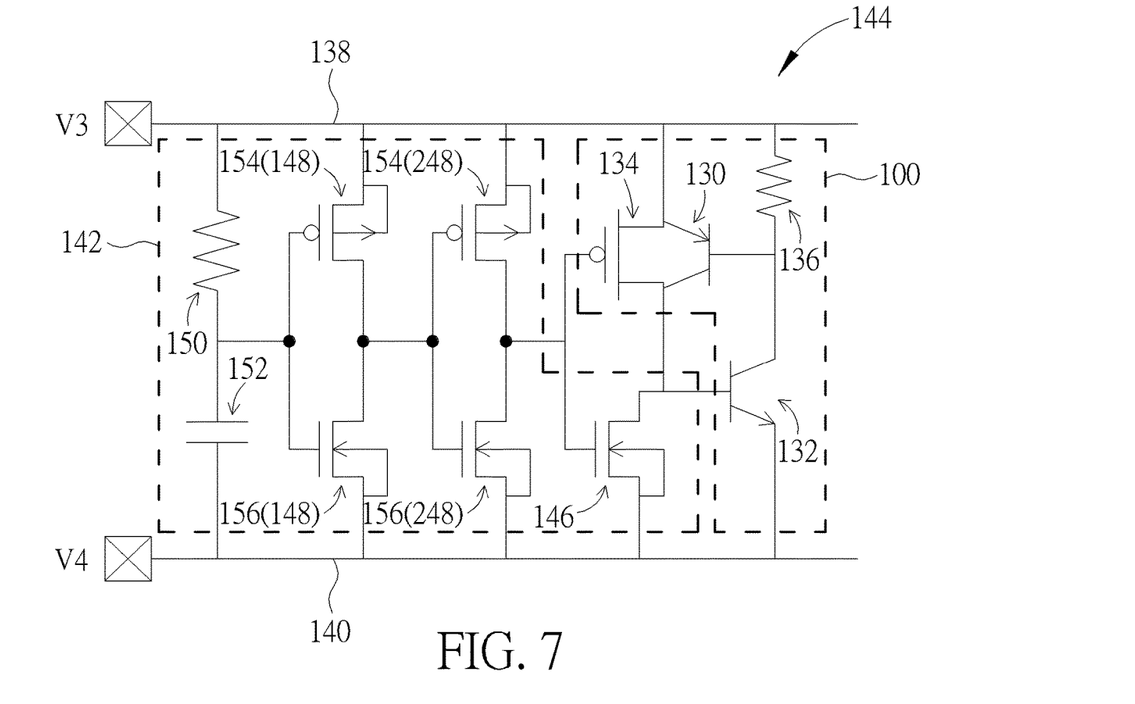
FIG. 7 depicts an equivalent circuit of an ESD protection structure according to a second preferred embodiment of the present invention.
Figure 8:
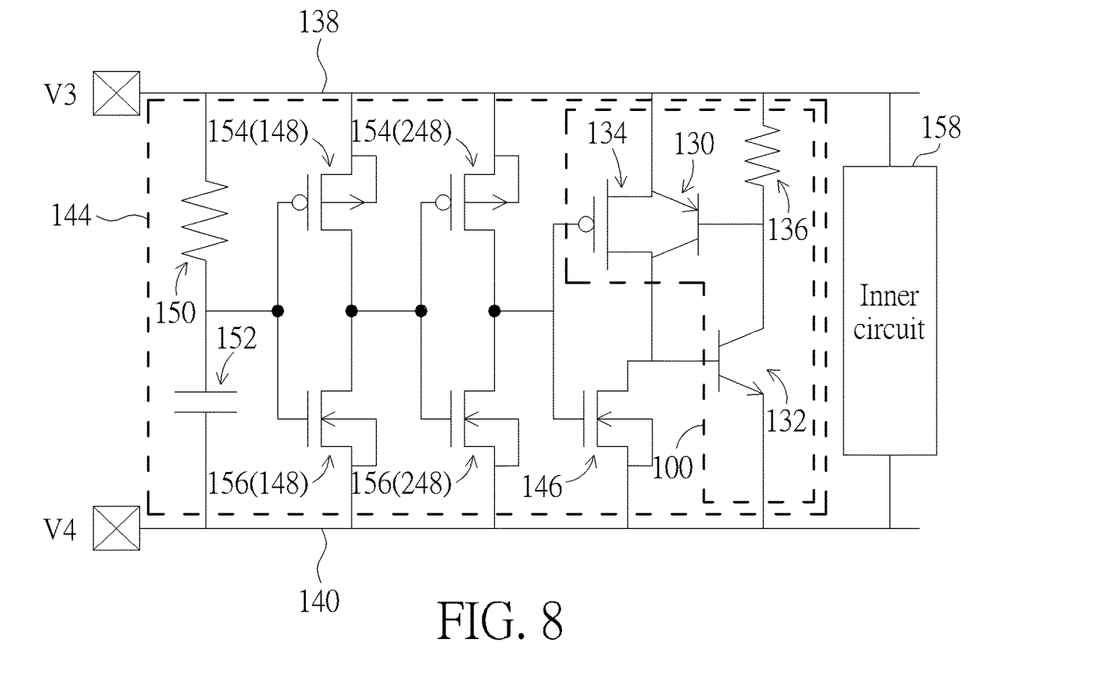
FIG. 8 depicts an ESD protection structure coupled to an inner circuit according to a second preferred embodiment of the present invention.

FIG. 6 depicts schematically an SCR electrically connected to an ESD protection circuit according to a second preferred embodiment of the present invention. FIG. 7 depicts an equivalent circuit of an ESD protection structure according to a second preferred embodiment of the present invention. FIG. 8 depicts an ESD protection structure coupled to an inner circuit according to a second preferred embodiment of the present invention.

As shown in FIG. 6 and FIG. 7, the first P-type doped region 118, the N-type well 112 and the P-type well 114 together form a PNP transistor 130. The N-type well 112, the P-type well 114 and the second N-type doped region 124 together form an NPN transistor 132. The gate structure 116, the first P-type doped region 118 and the second P-type doped region 120 form a first P-type transistor 134. The PNP transistor 130 electrically connects to the NPN transistor 132 in series. The resistance of the substrate 110 is represented by a resistor 136. The resistor 136 electrically connects to the PNP transistor 130 and the NPN transistor 132 in series. In detail, the first P-type doped region 118 and the first N-type doped region 122 electrically connect to a first conductive line 138. The second N-type doped region 124 electrically connects to a second conductive line 140. A first voltage V3 is applied to the first conductive line 138 and a second voltage V4 is applied to the second conductive line 140, where the first voltage V3 is greater than the second voltage V4. For example, the first voltage V3 can be a power supply, and the second voltage V4 can be ground. In another example, the first voltage V3 can be an I/O voltage, and the second voltage V4 can be ground. The first voltage V3 and the second voltage V4 are not limited to those mentioned above, however. Other types of voltage terminals can serve as the first voltage V3 and the second voltage V4 as long as the first voltage V3 is greater than the second voltage V4.

Continue to refer to FIG. 6 and FIG. 7. The SCR 100 electrically connects to an ESD protection circuit 142. The SCR 100 and the ESD protection circuit 142 form an ESD protection structure 144. The ESD protection circuit 142 consists of/only includes a first N-type transistor 146, a first inverter 148, a second inverter 248, a resistor 150 and a capacitor 52. A drain of the first N-type transistor 146 electrically connects to the P-type well 114 through the second P-type doped region 120. A source of the first N-type transistor 146 electrically connects to the second conductive line 140. The first inverter 148 couples to the second inverter 248 in series. The first inverter 148 and the second inverter 248 have the same structure. The first inverter 148 and the second inverter 248 respectively include a second P-type transistor 154 and a second N-type transistor 156. The second P-type transistor 154 electrically connects to the second N-type transistor 156 in series. A source of the second P-type transistor 154 in, respectively, the first inverter 148 and the second inverter 248 electrically connects to the first conductive line 138. A source of the second N-type transistor 156 in, respectively, the first inverter 148 and the second inverter 248 electrically connects to the second conductive line 140. Furthermore, a gate of the first N-type transistor 146, the gate structure 116, a drain of the second P-type transistor 154 of the second inverter 248 and a drain of the second N-type transistor 156 of the second inverter are electrically connected. A gate of the second P-type transistor 154 of the first inverter 148 electrically connects to the resistor 150 and the capacitor 152. A gate of the second N-type transistor 156 of the first inverter 148 electrically connects to the resistor 150 and the capacitor 152. The resistor 150 electrically connects to the first conductive line 138. The capacitor 152 couples to the resistor 150 in series. The capacitor 152 electrically connects to the second conductive line 140.

As shown in FIG. 8, an inner circuit 158 electrically connects to the first conductive line 138 and the second conductive line 140 and electrically connects to the ESD protection structure 144 in parallel. When the electrostatic pulse enters the first conductive line 138, a trigger voltage is generated between the resistor 150 and the capacitor 152 to turn on the first inverter 148 and the second inverter 248, which thereby switch on the first P-type transistor 134 to activate the SCR 100. After activating the SCR 100, the electrostatic pulse in the first conductive line 138 goes through the SCR 100 into the second conductive line 140. Therefore, the electrostatic pulse will not damage the inner circuit 158.

Figure 9:
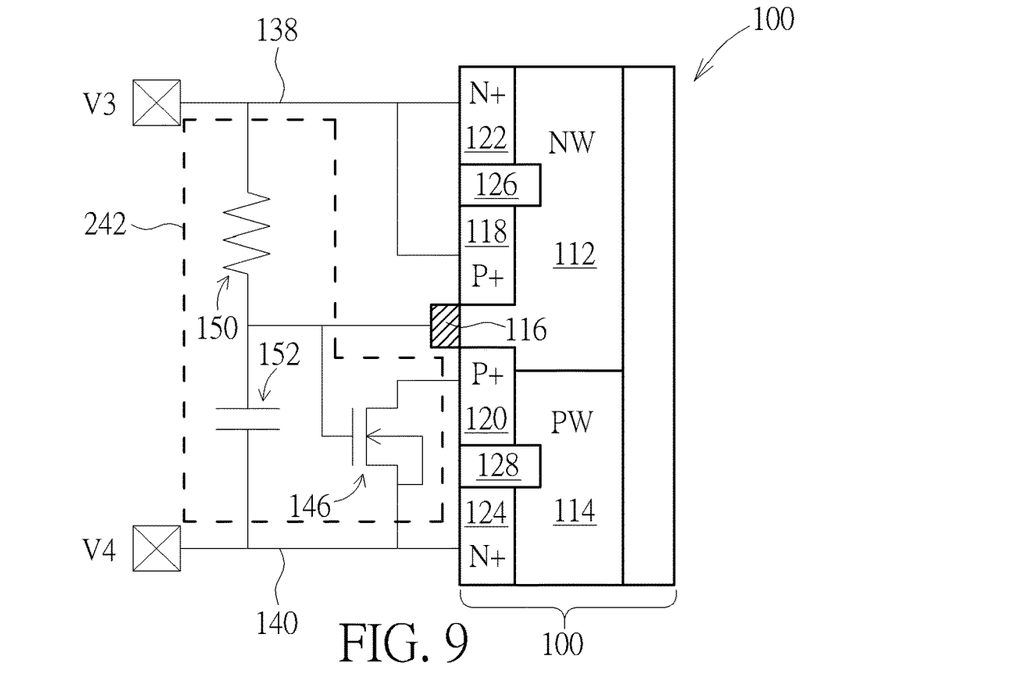
FIG. 9 depicts schematically an SCR electrically connected to an ESD protection circuit according to a third preferred embodiment of the present invention.
Figure 10:
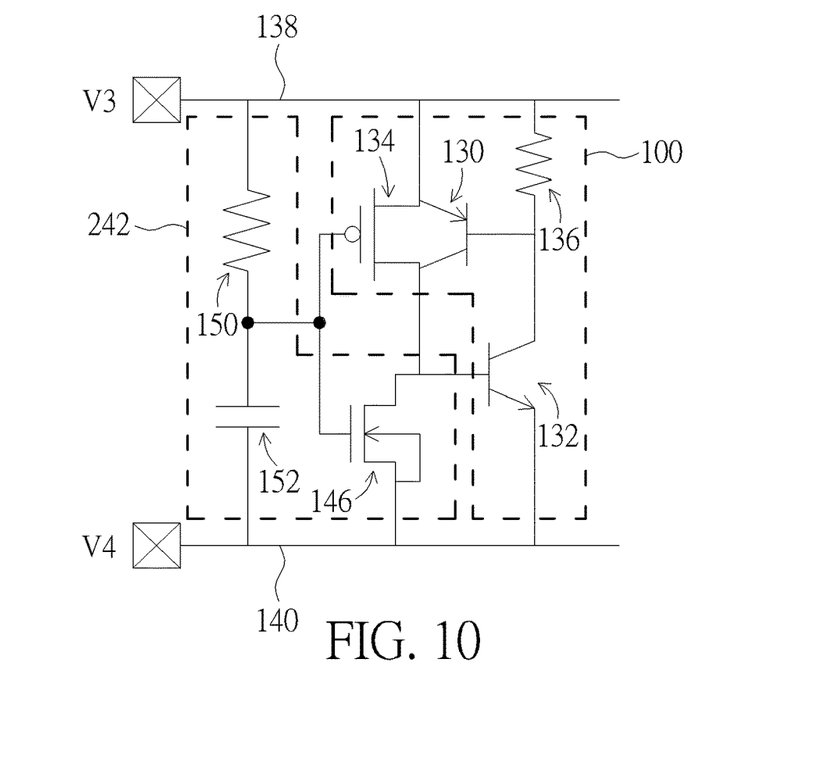
FIG. 10 depicts an equivalent circuit of an ESD protection structure according to a third preferred embodiment of the present invention.

FIG. 9 depicts schematically an SCR electrically connected to an ESD protection circuit according to a third preferred embodiment of the present invention. FIG. 10 depicts an equivalent circuit of an ESD protection structure according to a third preferred embodiment of the present invention, wherein elements which are substantially the same as those in the second preferred embodiment are denoted by the same reference numerals; an accompanying explanation is therefore omitted. In the third preferred embodiment, the ESD protection circuit 142 in the second preferred embodiment is replaced by the ESD protection circuit 242. Apart from the absence of the first inverter 148 and the second inverter 248 in the ESD protection circuit 242, the SCR 100 electrically connects to the ESD protection circuit 242 in the same way as the ESD protection circuit 142.

Refer to FIG. 9 and FIG. 10. The ESD protection circuit 242 consists of/only includes a first N-type transistor 146, the resistor 150 and the capacitor 152. A drain of the first N-type transistor 146 electrically connects to the P-type well 114. A source of the first N-type transistor 146 electrically connects to the second conductive line 140. The resistor 150 electrically connects to the first conductive line 138. The capacitor 152 couples to the resistor in series. The capacitor 150 electrically connects to the second conductive line 140. The capacitor 152, the resistor 150, the gate structure 116 of the first P-type transistor 134 and the gate of the first N-type transistor 146 are electrically connected. When the electrostatic pulse enters the first conductive line 138, a trigger voltage is generated between the resistor 150 and the capacitor 152 to turn on the first P-type transistor 134 in order to activate the SCR 100. After activating the SCR 100, the electrostatic pulse in the first conductive line 138 goes through the silicon controlled rectifier 100 into the second conductive line 140.

The ESD protection structure of the present invention uses an RC delay to detect whether the current entering the first conductive line is an electrostatic pulse or a normal operation current. If the RC delay occurs, the ESD protection structure turns on. The ESD protection structure of the present invention turns on faster than the conventional ESD protection structure due to the use of the RC delay. Furthermore, during normal operation, the first P-type transistor in the first preferred embodiment, and the first N-type transistor in the second and third preferred embodiments can drain the current in the SCR. Therefore, the holding voltage of the SCR is increased and the chance of a latch up-problem occurring is decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An ESD protection structure, comprising:
a silicon controlled rectifier consisting of:
a substrate;
an N-type well disposed in the substrate;
a P-type well disposed in the substrate;
a gate structure disposed on the substrate and on the P-type well;
a first N-type doped region disposed in the N-type well and at one side of the gate structure;
a second N-type doped region disposed in the P-type well and at another side of the gate structure;
a first P-type doped region disposed in the N-type well;
a second P-type doped region disposed in the P-type well;

a first shallow trench isolation (STI) embedded in the N-type well and disposed between the first N-type doped region and the first P-type doped region; and
a second STI embedded in the P-type well and disposed between the second N-type doped region and the second P-type doped region.

2. The ESD protection structure of claim 1, wherein part of the first N-type doped region extends into the P-type well.

3. The ESD protection structure of claim 1, wherein the first N-type doped region is disposed closer to the P-type well than the first P-type doped region along a horizontal direction.

4. The ESD protection structure of claim 1, wherein the second N-type doped region is disposed closer to the N-type well than the second P-type doped region along a horizontal direction.

5. The ESD protection structure of claim 1, wherein the first P-type doped region, the N-type well and the P-type well together form a PNP transistor.

6. The ESD protection structure of claim 5, wherein the N-type well, the P-type well and the second N-type doped region together form a NPN transistor.

7. The ESD protection structure of claim 6, wherein the gate structure, the first N-type doped region and the second N-type doped region together form a first N-type transistor.

8. The ESD protection structure of claim 7, wherein the first P-type doped region electrically connects to a first conductive line, the second N-type doped region electrically connects to a second conductive line, a first voltage is applied to the first conductive line, a second voltage is applied to the second conductive line, and the first voltage is greater than the second voltage.

9. The ESD protection structure of claim 8, further comprising an ESD protection circuit, wherein the ESD protection circuit consists of:
a first P-type transistor coupling the N-type well to the first conductive line;
an inverter comprising a second P-type transistor coupled to a second N-type transistor in series, wherein a source of the second P-type transistor electrically connects to the first conductive line, a source of the second N-type transistor electrically connects to the second conductive line, and a gate of the first P-type transistor, the gate structure, a drain of the second P-type transistor and a drain of the second N-type transistor are electrically connected;
a resistor electrically connecting to the first conductive line; and
a capacitor coupling to the resistor in series, wherein the capacitor electrically connects to the second conductive line, and the resistor, the capacitor, a gate of the second P-type transistor and a gate of the second N-type transistor are electrically connected.

10. The ESD protection structure of claim 9, wherein when the electrostatic pulse enters the first conductive line, a trigger voltage is generated between the resistor and the capacitor to turn on the inverter, the inverter is turned on to switch on the first N-type transistor to activate the silicon controlled rectifier, and after activating the silicon controlled rectifier, the electrostatic pulse in the first conductive line goes through the silicon controlled rectifier into the second conductive line.

11. An ESD protection structure, comprising:
a silicon controlled rectifier consisting of:
a substrate;
an N-type well disposed in the substrate;
a P-type well disposed in the substrate;
a gate structure disposed on the substrate and on the N-type well;
a first P-type doped region disposed in the N-type well and at one side of the gate structure;
a second P-type doped region disposed in the P-type well and at another side of the gate structure;
a first N-type doped region disposed in the N-type well;
a second N-type doped region disposed in the P-type well;
a first STI embedded in the N-type well and disposed between the first P-type doped region and the first N-type doped region; and
a second STI embedded in the P-type well and disposed between the second P-type doped region and the second N-type doped region.

12. The ESD protection structure of claim 11, wherein part of the second P-type doped region extends into the N-type well.

13. The ESD protection structure of claim 11, wherein the first P-type doped region is disposed closer to the P-type well than the first N-type doped region along a horizontal direction.

14. The ESD protection structure of claim 11, wherein the second P-type doped region is disposed closer to the N-type well than the second N-type doped region along a horizontal direction.

15. The ESD protection structure of claim 11, wherein the first P-type doped region, the N-type well and the P-type well together form a PNP transistor.

16. The ESD protection structure of claim 15, wherein the N-type well, the P-type well and the second N-type doped region together form an NPN transistor.

17. The ESD protection structure of claim 16, wherein the gate structure, the first P-type doped region and the second P-type doped region together form a first P-type transistor.

18. The ESD protection structure of claim 17, wherein the first P-type doped region electrically connects to a first conductive line, the second N-type doped region electrically connects to a second conductive line, a first voltage is applied to the first conductive line, a second voltage is applied to the second conductive line, and the first voltage is greater than the second voltage.

19. The ESD protection structure of claim 18, further comprising an ESD protection circuit, wherein the ESD protection circuit consists of:
a first N-type transistor, wherein a drain of the first N-type transistor electrically connects to the P-type well, and a source of the first N-type transistor electrically connects to the second conductive line;
a resistor electrically connecting to the first conductive line; and
a capacitor coupled to the resistor in series, wherein the capacitor electrically connects to the second conductive line, and the resistor, the capacitor, the gate structure of the first P-type transistor and a gate of the first N-type transistor are electrically connected.

20. The ESD protection structure of claim 18, further comprising an ESD protection circuit, wherein the ESD protection circuit consists of:
a first N-type transistor, wherein a drain of the first N-type transistor electrically connects to the P-type well, and a source of the first N-type transistor electrically connects to the second conductive line;
a resistor electrically connecting to the first conductive line;

a capacitor coupling to the resistor in series, wherein the capacitor electrically connects to the second conductive line;

a first inverter coupling to a second inverter, the first inverter comprising a second P-type transistor coupling to a second N-type transistor in series, and the second inverter comprising a third P-type transistor coupling to a third N-type transistor in series, wherein the first inverter couples the first conductive line and the second conductive line, the second inverter couples the first conductive line and the second conductive line, a gate of the first N-type transistor, the gate structure, a drain of the third P-type transistor and a drain of the third N-type transistor are electrically connected, a gate of the second P-type transistor electrically connects to the resistor and the capacitor, and a gate of the second N-type transistor electrically connects to the resistor and the capacitor.

21. The ESD protection structure of claim 20, wherein when an electrostatic pulse enters the first conductive line, a trigger voltage is generated between the resistor and the capacitor to turn on the first inverter and the second inverter, the first inverter and the second inverter are turned on to switch on the first P-type transistor to activate the silicon controlled rectifier, and after activating the silicon controlled rectifier, the electrostatic pulse in the first conductive line goes through the silicon controlled rectifier into the second conductive line.

* * * * *